United States Patent [19]
Nagumo et al.

[11] Patent Number: 4,825,041
[45] Date of Patent: Apr. 25, 1989

[54] THERMAL DEVELOPING APPARATUS

[75] Inventors: Akihiko Nagumo; Minoru Ishikawa, both of Kanagawa, Japan

[73] Assignee: Fuji Photo Film Co., Ltd., Kanagawa, Japan

[21] Appl. No.: 943,235

[22] Filed: Dec. 18, 1986

[30] Foreign Application Priority Data

Dec. 19, 1985 [JP] Japan .................. 60-284391
Jan. 24, 1986 [JP] Japan .................. 61-12099

[51] Int. Cl.⁴ .............................. H05B 1/00
[52] U.S. Cl. ............................. 219/244; 219/216; 219/469; 355/3 FU; 355/14 FU; 430/138; 432/60
[58] Field of Search ............ 219/244, 216, 243, 469, 219/470, 471; 355/3 FU, 14 FU, 28, 27; 432/60, 228; 430/98, 99, 138

[56] References Cited

U.S. PATENT DOCUMENTS

| 3,469,077 | 9/1969 | Petersen et al. | 219/216 |
| 3,637,976 | 1/1972 | Ohta et al. | 219/216 |
| 3,946,199 | 3/1976 | Nakamura | 219/216 |
| 4,095,886 | 6/1978 | Koeleman | 219/216 |
| 4,104,692 | 8/1978 | Sudo et al. | 219/216 |
| 4,132,882 | 1/1979 | Endo et al. | 219/216 |
| 4,205,220 | 5/1980 | O'Brien | 219/216 |
| 4,242,566 | 12/1980 | Scribner | 219/216 |
| 4,253,008 | 2/1981 | Dolan | 219/216 |
| 4,304,985 | 12/1981 | Miller | 219/216 |
| 4,435,633 | 3/1984 | Stryjewski | 219/216 |
| 4,464,561 | 8/1984 | Hulin | 219/216 |
| 4,603,245 | 7/1986 | Yagasaki | 219/216 |
| 4,629,675 | 12/1986 | Takehara | 430/403 |
| 4,672,177 | 1/1987 | Headrick | 219/216 |

Primary Examiner—A. D. Pellinen
Assistant Examiner—H. L. Williams
Attorney, Agent, or Firm—Sughrue, Mion, Zinn, Macpeak & Seas

[57] ABSTRACT

A thermally developing apparatus for a light and pressure sensitive material. The exposed material is inserted between a rotating heated roller and an endless belt wrapped partially around the roller. Additionally, a temperature sensor detects abnormally high temperatures and, as a result, removes the material from the heated roller.

6 Claims, 2 Drawing Sheets

THERMAL DEVELOPING APPARATUS

BACKGROUND OF THE INVENTION

1. Field of the Invention

The present invention generally relates to a thermally developing image printing apparatus. It particularly relates to an apparatus for thermally developing a light and pressure sensitive thermally developing material composed of a support and an active material applied thereon. The material is photosensitive and is able to be thermally developed to obtain a picture which can be fixed by pressure.

2. Background of the Invention

As an example of an image recording material prepared by utilizing microcapsules containing photosensitive components, there is known a system having a support carrying synthetic macromolecular resin wall capsules each containing a vinyl compound, a photopolymerization initiator, and a colorant precursor. Such a system is disclosed, for example, in Japanese Patent Unexamined Publication No. 179,836/1982. In the image recording method utilizing the system described above, microcapsules are exposed to image carrying light and are hardened in correspondence to the image and whatever microcapsules remain non-hardened are exploded by pressure to thereby obtain a color picture by the colorant precursors released from the exploded microcapsules. This method employing the system is featured in that a high-quality picture can be obtained through a simple dry process. The system, however, has the disadvantage that the photosensitivity is extremely small compared to a silver halide system.

In order to eliminate the foregoing disadvantage, there has been proposed a new highly photosensitive recording material by which a high-quality picture can be obtained through a simple dry process, as disclosed in Japanese Patent Application Nos. 117089/1985 and 121284/1985 filed by the same applicant of this application. This recording material is a photo-pressure sensitive thermally developing material composed of a support carrying thereon at least a photosensitive silver halide, a reducing agent, a compound which can be polymerized (hereinafter, referred to as a polymerizable compound), and a color-picture forming material. At least the polymerizable compound and the color-picture forming material are composed of photosensitive components contained in the same microcapsules.

To record a picture by using this light and pressure sensitive thermally developing material, the material is exposed with imaging light to form a latent image on the material. The material is then developed by heat to polymerize the polymerizable compound to produce a high molecular compound so as to harden the microcapsules in the position where the latent image exists. Next, the material is put on a picture receptor to which the color-picture forming material can be transferred. The material is pressured against the receptor so that at least a part of the microcapsules in the position where the latent image does not exist are exploded so as to transfer to color-picture forming material to the picture receptor to thereby obtain a picture on the picture receptor.

In order to obtain a high-quality picture in the case where a picture is recorded by using such a photo-pressure sensitive thermally developing material as described above, it is necessary to take sufficient time for a thermally developing process and it is desirable to prevent the photo-pressure sensitive thermally developing material from coming in contact with air (oxygen) as much as possible during the heating process. This is because the reducing agent contained in the photo-pressure sensitive thermally developing material is oxidized or the polymerizable compound in the material is inhibited from being polymerized to thereby prevent a high molecular compound form being produced, so that development cannot be performed efficiently and high-quality pictures cannot be obtained.

Further, in an apparatus for thermally developing such a light and pressure sensitive thermally developing material as described above, in some cases, a heating roller is used for heating. The light and pressure sensitive thermally developing material is conveyed while being in contact with this heating roller so as to be thermally developed. In this case, however heating might be performed at a temperature higher than a predetermined value by an abnormality occurring in the heater for one cause or another. In this case, not only can satisfactory development not be performed but the light and pressure sensitive thermally developing material may be overheated to present a risk of a fire.

SUMMARY OF THE INVENTION

An object of the present invention is, therefore, to eliminate the foregoing disadvantages in the prior art.

In particular, an object of the present invention is to provide an apparatus for thermally developing a light and pressure sensitive thermally developing material, in which the light and pressure sensitive thermally developing material can be prevented from coming into contact with air during thermal development, in which sufficient heating time can be secured, in which satisfactory thermal efficiency can be obtained, and the size can be made compact.

A further object of the present invention is to provide an apparatus for thermally developing a photo-pressure sensitive thermally developing material, in which the photo-pressure sensitive thermally developing material can be satisfactorily developed without being overheated so that a fire due to overheating of the light and pressure sensitive thermally developing material can be prevented.

In order to attain the above-mentioned objects, according to the present invention, a light and pressure sensitive thermally developing material (hereinafter simply referred to as "a sensitive material") is composed of a support carrying thereon a material which is photosensitive and which can be thermally developed to obtain a picture which can be fixed by pressure. The apparatus for thermally developing this sensitive material comprises a heating roller and an endless belt. The endless belt is arranged to move in the same direction as the rotational direction of the heating roller while contacting with a part of an outer peripheral surface of the heating roller so that the light and pressure sensitive thermally developing material is thermally developed under the condition that the material is being conveyed while being sandwiched between the heating roller and the endless belt.

The thermally developing apparatus according to the present invention can be used for thermally developing a material composed of photosensitive components and a picture receptor applied onto one and the same support.

The temperature detector according to the present invention may be, for example, a temperature sensor directly attached to the surface of the heating roller in order to detect the temperature of the heater itself or a contactless temperature sensor attached in the vicinity of the sensitive material in order to detect the temperature of the sensitive material itself during the thermal development of the material.

Alternatively, the temperature detector according to the present invention may be a temperature sensor for detecting an atmospheric temperature in the periphery of the sensitive material during the thermal development of the material.

Further, the heater according to the present invention may be an electric heater. In this case, the heat stopping means may stop current supplied to the heater.

Further, the heater according to the present invention may be, for example, constituted by a heating roller and an endless belt for bringing the sensitive material into contact with the heating roller. In this case, the heating roller may be of the type in which a heater for heating the sensitive material is provided inside or outside the heating roller. In such a case where the heater means is constituted by a heating roller and an endless belt as described above, the heat stopping means may be arranged to separate the endless belt from the heating roller to hereby separate the sensitive material being developed from the heating roller.

The sensitive material used in the thermally developing apparatus according to the present invention may be a material arranged such that a thermally developed picture is transferred by pressure onto a picture receptor prepared separately from the material or onto a picture-receiving layer provided on the same support on which the material is provided.

The present invention will be apparent from the following detailed description taken in conjunction with the accompanying drawings.

DETAILED DESCRIPTION OF THE PREFERRED EMBODIMENTS

Embodiments of the thermally developing apparatus according to the present invention will be described with reference to the accompanying drawings hereunder.

Figure 1:
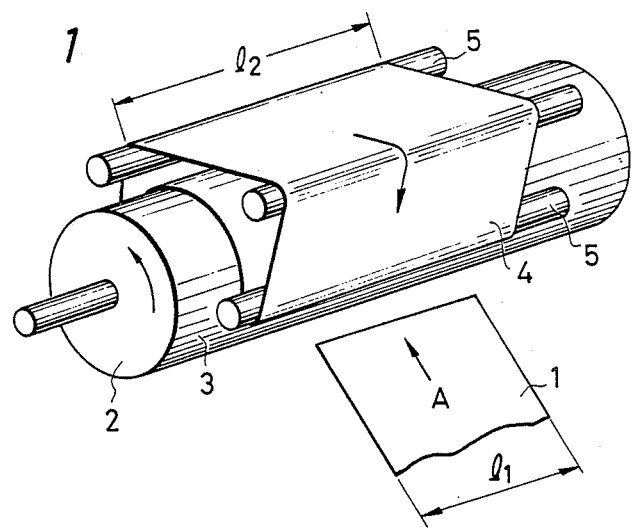
FIG. 1 is a perspective view showing the main part of an embodiment of the thermally developing apparatus according to the present invention.
Figure 2:
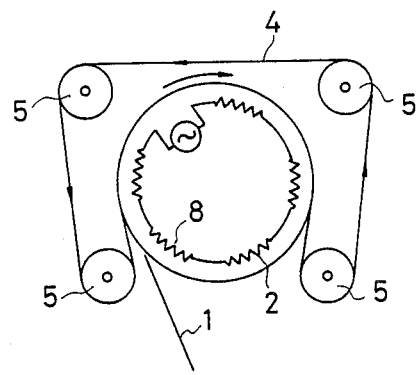
FIG. 2 is a schematic side view showing the embodiment of FIG. 1.

FIGS. 1 and 2 are a perspective view and a schematic side view, respectively, showing an embodiment according to the present invention. As illustrated in FIGS. 1 and 2, an endless belt 4 is wound around an outer peripheral surface 3 of a heating roller 2 at a predetermined angle. The endless belt 4 is made of a flexible heat-resistant material which has, preferably, no gas-permeability and an exfoliative property so that the endless belt 4 is not stuck to a sensitive material 1. The endless belt 4 may be made of glass fiber cloth coated with TEFLON (registered trademark of DuPont DeNemours and Company, for polytetrafluoroethylene), or the like.

This endless belt 4 is engaged with rotatably supported auxiliary roller 5. The width $l_2$ of the endless belt 4 is selected to be larger than the width $l_1$ of the sensitive material 1.

The heating roller 2 is made a hollow body within which heater means (not shown) is provided. As the heater means, a halogen lamp heater, an infrared ray lamp heater, a nichrome wire heater 8 (as shown schematically in FIG. 2), a ceramic heater, or the like, may be used.

The heating roller 2 may be arranged such that a heated heat-medium is introduced into the heating roller 2 so as to perform the heating operation, or that an induction coil is provided inside or outside the heating roller 2 and an AC voltage is applied to the introduction coil to cause eddy currents in the body of the heating roller 2 so as to perform the heating operation by Joule heat due to the eddy currents. Further, the heating roller 2 is arranged to be driven to rotate by driving means (not shown) such as an electric motor or the like through a gear, a chain, or the like. The endless belt 4 is driven by the heating roller 2 to move in the same direction as the heating roller 2. The auxiliary rollers 5 may be driven by the heating roller 2, or the auxiliary rollers 5 as well as the heating roller 2 may be driven.

When the exposed sensitive material 1 is supplied to the thus arranged thermally developing apparatus, the sensitive material 1 is taken between the heating roller 2 and the endless belt 4. While being heated by the heating roller 2, the sensitive material 1 is completely covered with the flexible endless belt 4 having a width larger than that of the sensitive material 1. In this case, the photosensitive component carrying surface of the sensitive material 1 is made to contact with either one of the heating roller 2 and the endless belt 4. In either case, the sensitive material 1 is urged against the endless belt 4 so that the photosensitive component carrying surface of the sensitive material 1 can be brought into contact tightly and uniformly to thereby make it possible that the photosensitive component carrying surface is not only prevented from coming into contact with air but heated uniformly and efficiently. Especially in the case where the photosensitive components and the heating roller 2 are made to come into contact with each other, the thermal efficiency is excellent. Further, sufficient time can be taken for heating the sensitive material 1 because the sensitive material 1 is heated while the heating roller 2 is turned, for example, by 180 degrees or more.

The temperature for heating the sensitive material 1 by the heating roller 2 is generally selected to be 80° C.-200° C., preferably 100° C.-160° C., although it may vary more or less corresponding to the characteristics of the sensitive material 1.

Although the heating roller 2 is arranged to be directly heated by the heater means in the foregoing embodiment, the present invention is not limited to this, but the endless belt 4 may be arranged to be itself directly heated, or both the heating roller 2 and the endless belt 4 may be arranged to be heated.

Figure 3:
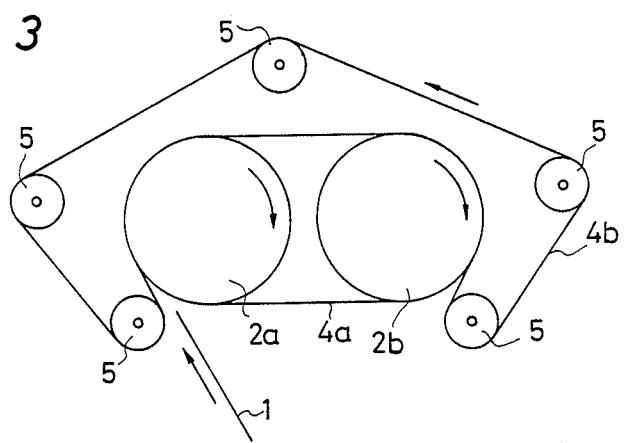
FIG. 3 is a schematic side view showing another embodiment of the thermally developing apparatus according to the present invention.

Although a single heating roller 2 is used in the foregoing embodiment, the present invention is not limited to this, but two heating rollers 2 may be used as shown in FIG. 3. In this case, a first belt 4a is put around first and second heating rollers 2a and 2b so as to rotate the first and second heating rollers 2a and 2b integrally with each other, and a second belt 4b put around auxiliary rollers 5 overhangs both the heating rollers 2a and 2b. A sensitive material 1 is conveyed while being heated in the state where the sensitive material 1 is sandwiched between the first and second belts 4a and 4b. In this case, the respective heat processing temperatures of the first and second heating rollers 2a and 2b can be variously changed corresponding to the characteristics of the sensitive material 1. For example, the heat processing temperature by the first heating roller 2a may be selected to be lower than that of the second heating roller 2b.

Figure 4:
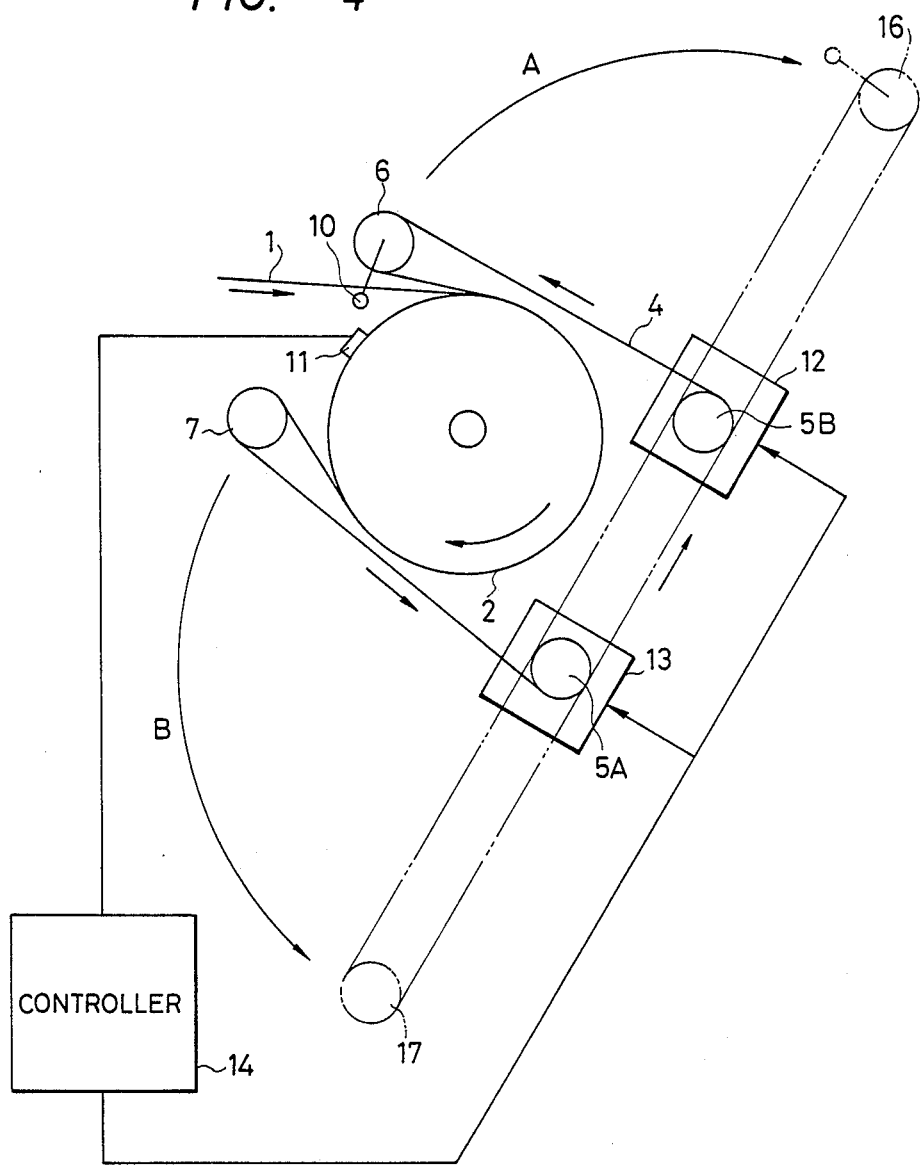
FIG. 4 is a schematic side view showing a further embodiment of the thermally developing apparatus according to the present invention.

FIG. 4 is a schematic side view showing a further embodiment of the thermally developing apparatus according to the present invention. In this embodiment of FIG. 4, items corresponding to those of the foregoing embodiments are correspondingly referenced, and the explanation about them is omitted.

A heating roller 2 and an endless belt 4 are arranged in such a manner as illustrated in FIG. 4 in order to heat a sensitive material 1. That is, the endless belt 4 is wound around the outer peripheral surface of the heating roller 2 over a predetermined revolutional angle of the roller 2 while being entrained so as to engage with fixed rollers 5A and 5B as well as movable rollers 6 and 7 to thereby move in the same direction as the heating roller 2.

The structure and properties of the endless belt 4 and the heating roller are the same as in the embodiment of FIG. 1.

The movable roller 6 is attached to an arm (not shown) arranged to turn about a shaft of the fixed roller 5B so that the movable roller 6 can be turned in the direction of an arrow A to the position indicated by 16 as shown by a two-dot chained line. Similarly to the movable roller 6, the movable roller 7 is arranged to be turned in the direction of an arrow B to the position indicated by 17 as shown by a two-dot chained line. The rotation of the respective arms of the movable rollers 6 and 7 are turned by driving means 12 and 13 each constituted by an electric motor and a gear.

A temperature detection sensor 11 is provided in contact with the heating roller 2, and a detection signal from this temperature detection sensor 11 is applied to a control circuit 14 for controlling the driving means 12 and 13. The control circuit 14 controls the driving operation of the respective motors constituting the driving means 12 and 13.

The movable roller 6 is provided with a bar 10 separated from the movable roller 6 as shown in FIG. 4, and the sensitive material 1 to be thermally developed is conveyed between the movable roller 6 and the bar 10.

Next, description will be made as to the operation of the thus arranged thermally developing apparatus.

The sensitive material 1 supplied between the movable roller 6 and the bar 10 is conveyed while being sandwiched between the endless belt 4 and the heating roller 2. While being conveyed in this manner, the sensitive material 1 is urged against the heating roller 2 to thereby be thermally developed. The surface temperature of the heating roller 2 is always monitored by the temperature detection sensor 11. When the temperature of the heating roller 2 is abnormally increased from one cause or another, a signal for actuating the driving means 12 and 13 is produced from the control circuit 14, so that the movable rollers 6 and 7 are turned to the positions indicated by 16 and 17 respectively, as shown by the chained lines.

At this time, if the sensitive material 1 is positioned on the bar 10, the sensitive material 1 is hung by the bar 10 to move as the movable roller 6 turns and completely separated from the heating roller 2 at the separated position 16 of the movable roller 6 so that the sensitive material falls down from the bar 10 of its own weight. If the sensitive material 1 is not positioned on the bar 10 but sandwiched at almost any portion between the heating roller 2 and the endless belt 4, on the contrary, when the endless belt 4 is separated from the heating roller 2 as the movable roller 6 turns, the sensitive material 1 falls by its own weight, so that the sensitive material 1 is again completely separated from the heating roller 2.

Thus, when the temperature of the heating roller 2 is abnormally increased, the sensitive material 1 is separated from the heating roller 2 so that progression of thermal development on the sensitive material 1 is stopped, and therefore it is possible to prevent burning or combustion of the sensitive material 1 due to overheating.

Although the temperature detection sensor 11 is provided for detecting the surface temperature of the heating roller 2 in the foregoing embodiment, the temperature detection sensor 11 may be provided in the vicinity of the sensitive material 1 for detecting the temperature of the sensitive material 1 per se or may be provided for detecting an atmospheric temperature on the periphery of the sensitive material 1.

Further, stoppage of heating of the sensitive material 1 is performed by separation of the sensitive material 1 from the heating roller 2 in the foregoing embodiment. However, in the case where an electric heater is used as the heater means of the heating roller 2, the electric heater may be deenergized to thereby make it possible to stop the heating of the sensitive material 1.

As described above in detail, in the thermally developing apparatus according to the present invention, the flexible endless belt is caused to come into contact with the outer peripheral surface of the heating roller with a relatively large lapping angle, and a sensitive material is sandwiched between the heating roller and the endless belt in the substantially perfectly sealed-up state to be conveyed while being heated. Therefore, the sensitive material is hardly exposed to air during heating, so that it is possible to prevent a bad effect when the sensitive material contacts with air during the heating, and that sufficient heating time can be taken without increasing the apparatus in size. Consequently, according to the present invention, it is possible to obtain a thermally developing apparatus in which a thermally developing process is exceedingly satisfactorily and efficiently performed and which is reduced in size.

According to the present invention, in the case where an abnormality occurs in the heater from one cause or another to thereby perform heating at a temperature higher than a predetermined value when a sensitive material is thermally developed, the abnormal heating temperature is detected to thereby stop heating of the sensitive material. Therefore, it is possible to prevent the sensitive material from burning due to overheating or to prevent a fire from occurring. Consequently it is possible to realize a thermally developing apparatus with high safety.

What is claimed is:

1. An apparatus for thermally developing a light and pressure sensitive thermally developing material composed of a support and an active material applied thereon sealed from contact with air, said active material comprising microcapsules containing photosensitive compounds and being able to be thermally developed to obtain a picture which can be fixed by pressure bursting of at least some of said microcapsules, said apparatus comprising:

heater means for heating said photo-pressure sensitive thermally developing material and means for applying pressure to said material;

temperature detection means for detecting a temperature of heating said photo-pressure sensitive thermally developing material;

a rotating heating roller;

said heater means comprising means for heating said heating roller, a gas impermeable endless belt for bringing said photo-pressure sensitive thermally developing material into contact with said heating roller; and means for moving said endless belt in the same direction as the rotational direction of said heating roller while contacting a part of an outer peripheral surface of said heating roller, whereby said photo-pressure sensitive thermally developing material is thermally developed under the condition that said material is being conveyed while being sandwiched between the heating roller and said endless belt with the belt and roller sealing the thermally developing material from contact with the air; and heat stopping means comprising means responsive to said temperature detection means for separating said endless belt from said heating roller to thereby separate said photo-pressure sensitive thermally developing material from said heating roller indicative of said photo-pressure sensitive thermally developing material reaching a predetermined high temperature;

2. A thermally developing apparatus according to claim 1, in which said temperature detection means is arranged to detect a temperature of said heater means.

3. A thermally developing apparatus according to claim 1, in which said temperature detection means is arranged to detect a temperature of said photo-pressure sensitive thermally developing material.

4. A thermally developing apparatus according to claim 1, in which said temperature detection means is arranged to detect an atmospheric temperature in the periphery of said photo-pressure sensitive thermally developing material.

5. A thermal development method, comprising the steps of:

heating a roller;

rotating said roller;

moving a gas impermeable endless belt contacting a portion of an outer peripheral surface of said roller in the same direction as said rotation of said roller; and sandwiching between said roller and said endless belt a thermally developing, light and pressure sensitive material composed of a support and an active material applied thereon sealed from contact with air, said active material comprising microcapsules containing photosensitive compounds, and said sandwiching step comprises applying heat and pressure to said material in the absence of air to obtain a picture fixed by pressure bursting of at least some of said microcapsules, detecting the temperature at least in the vicinity of said roller; and separating said gas impermeable endless belt from said heating roller to thereby separate said photo-pressure sensitive thermally developing material from said heating roller to terminate heating thereof upon said detected temperature exceeding a predetermined value.

6. An apparatus for thermally developing a light and pressure sensitive thermally developing material composed of a support and an active material applied thereon sealed from contact with the air, said active material comprising microcapsules containing photosensitive compounds and being able to be thermally developed to obtain a picture which can be fixed by pressure bursting of at least some of said microcapsules, said apparatus comprising:

heater means for heating said photo-pressure sensitive thermally developing material, means for applying pressure to said material;

a temperature detection means for detecting a temperature for heating said photo-pressure sensitive thermally developing material; and heat stopping means for stopping said heater means from heating said photo-pressure sensitive thermally developing material in response to a signal from said temperature detection means, said heater means comprising a heating roller, said means for applying pressure to said material comprising a gas impermeable endless belt for bringing said photo-pressure sensitive thermally developing material into contact with said heating roller; a pair of fixed positioned rollers positioned in line with each other, and spaced from said heating roller, a pair of movable rollers movable from a first position in line with said fixed position rollers and outside of said fixed position rollers to a second position, respectively, on opposite sides of said heating roller, said endless belt being carried by said fixed rollers and said movable rollers with a portion facing said heating roller for peripheral contact therewith when said endless belt is displaced from said first position to said second position, means for driving said fixed position rollers means for shifting said movable rollers from said first position to said second position, said temperature detection means comprising a temperature sensor for sensing the temperature of the heating roller, and a control circuit operatively coupled to said temperature detection sensor and said shifting means for moving said movable roller from said second position to said first position and to thereby remove said sensitive material from contact with the periphery of the heating roller when the temperature of the heating roller reaches a predetermined high temperature.

* * * * *